United States Patent [19]
Nakamura

[11] Patent Number: 6,072,370
[45] Date of Patent: Jun. 6, 2000

[54] CLOCK EXTRACTION CIRCUIT

[75] Inventor: Satoshi Nakamura, Tokyo, Japan

[73] Assignee: NEC Corporation, Tokyo, Japan

[21] Appl. No.: 09/075,814

[22] Filed: May 12, 1998

[30] Foreign Application Priority Data

May 13, 1997 [JP] Japan ..................................... 9-122301

[51] Int. Cl.$^7$ ................. H03L 7/06; H04L 7/02
[52] U.S. Cl. ............................. 331/25; 331/11; 375/359; 375/360; 327/156; 327/159
[58] Field of Search ........................ 331/11, 25; 375/376, 375/359, 360; 360/51, 41; 327/156, 159

[56] References Cited

U.S. PATENT DOCUMENTS 3,452,294   6/1969   Mumford et al. ......................... 331/11

Primary Examiner—Arnold Kinkead
Attorney, Agent, or Firm—McGinn & Gibb P.C.

[57] ABSTRACT

A high operational speed clock extraction circuit, which can be manufactured to be compact at low cost. In order to reduce the operational speed of a phase comparator, phases are compared between a signal obtained by frequency-dividing an inputted non-return zero signal by m and a signal obtained by frequency-dividing an extracted clock signal outputted from a voltage control oscillator by n. In addition, in order to correctly compare phases between the frequency-divided signals, edge pulses used for phase comparison and produced based on the frequency-divided input signals are divided by an edge pulse selecting circuit according to cases, specifically between a case of performing phase comparison for the rising edge of a frequency-divided clock and a case of performing phase comparison for the falling edge of the same. Then, phase comparison is performed based on each of the edge pulses. The output of each phase comparison is passed through a low pass filter to control the voltage control oscillator.

3 Claims, 10 Drawing Sheets

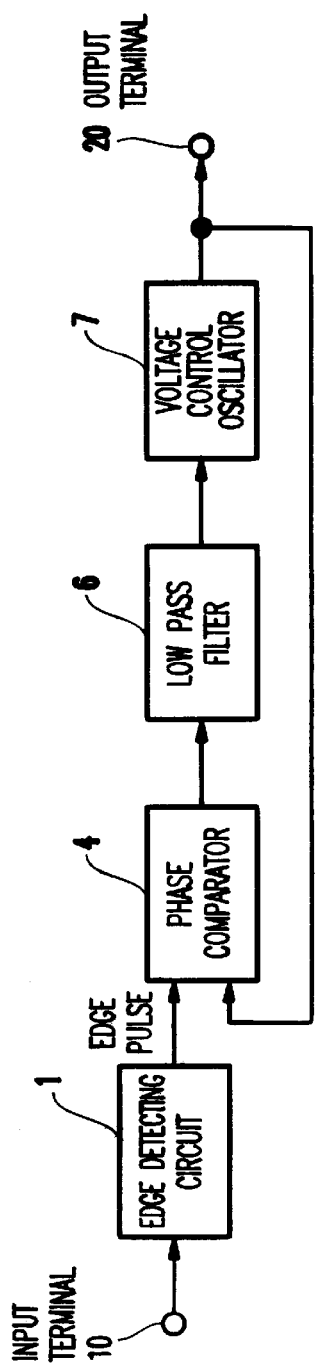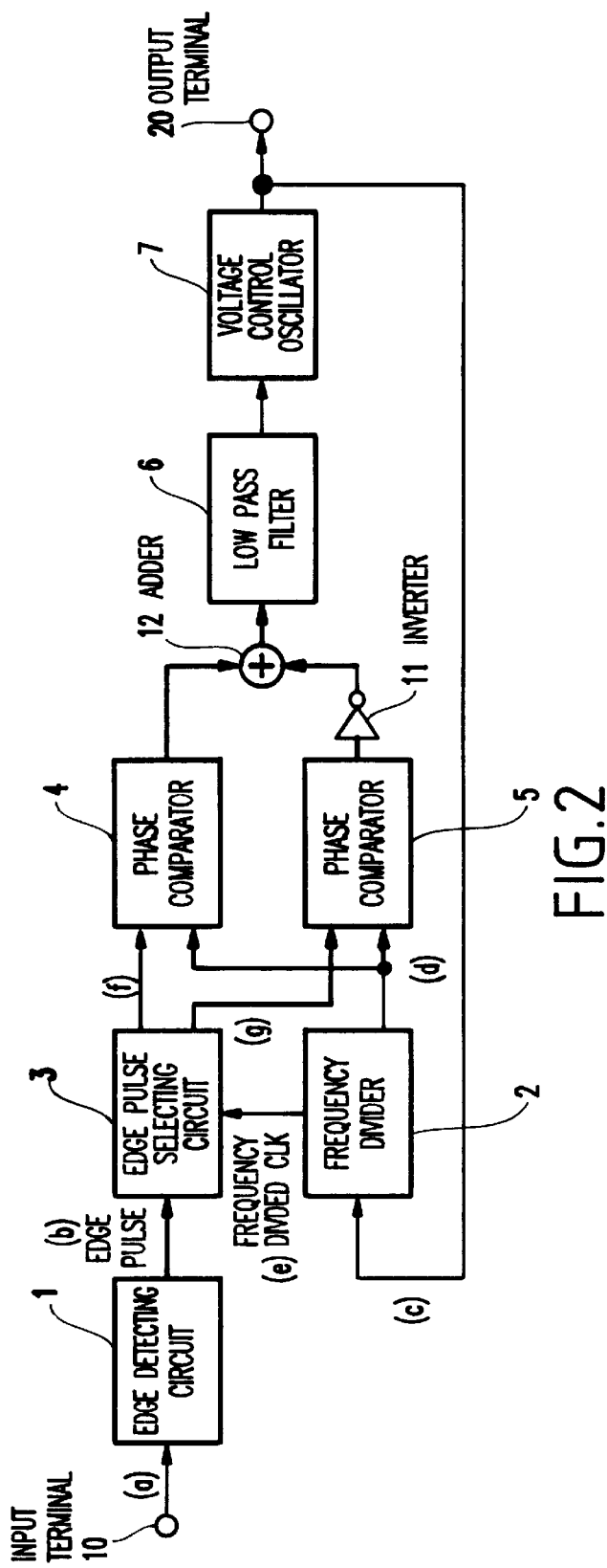

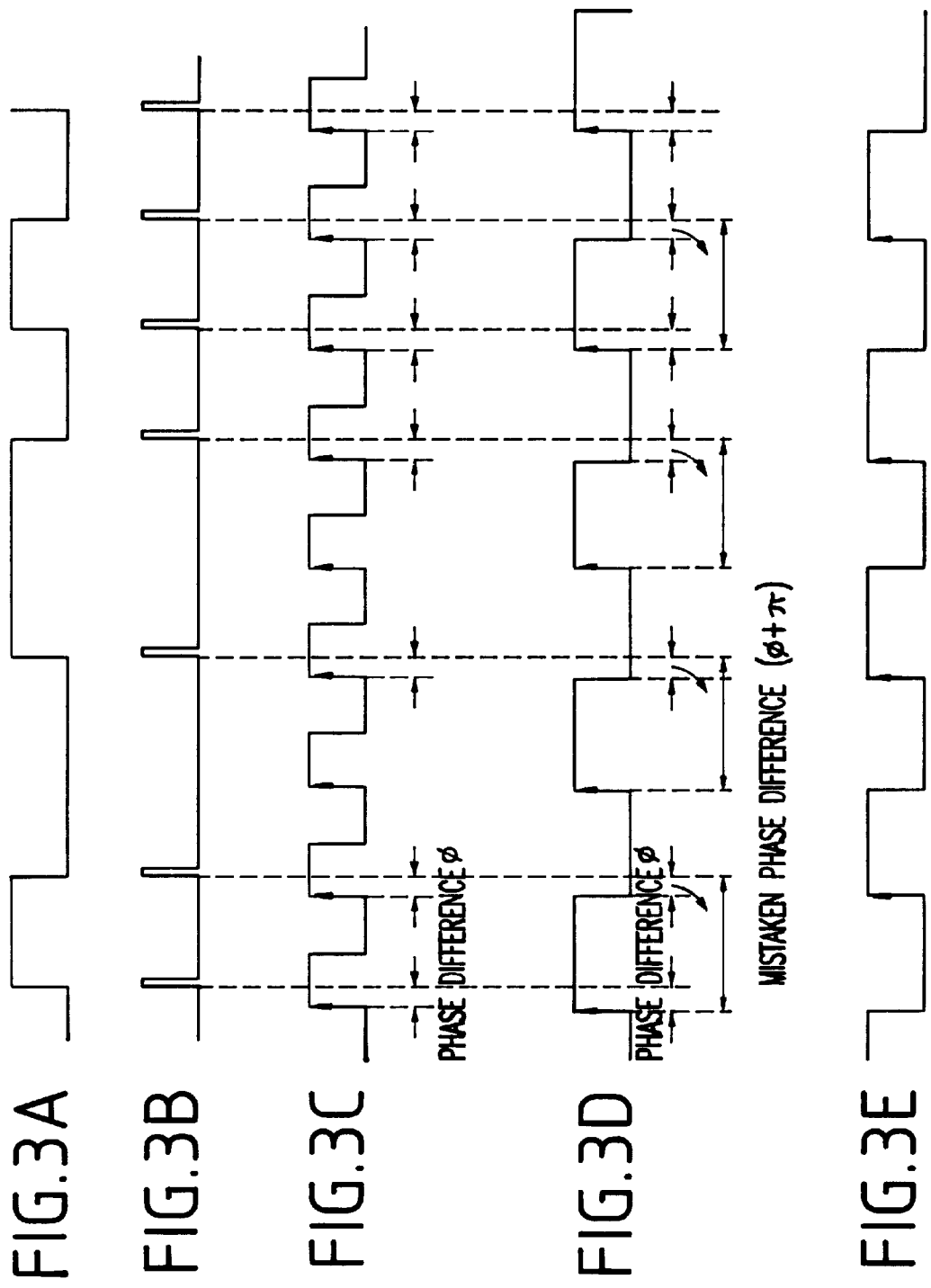

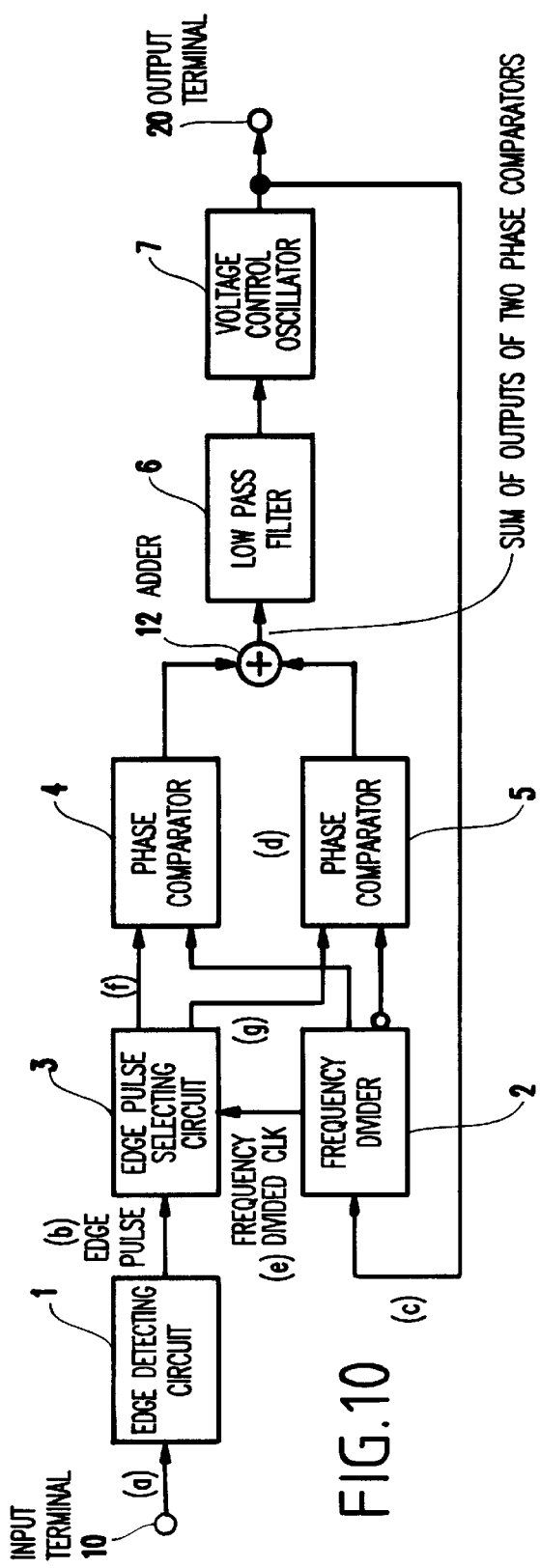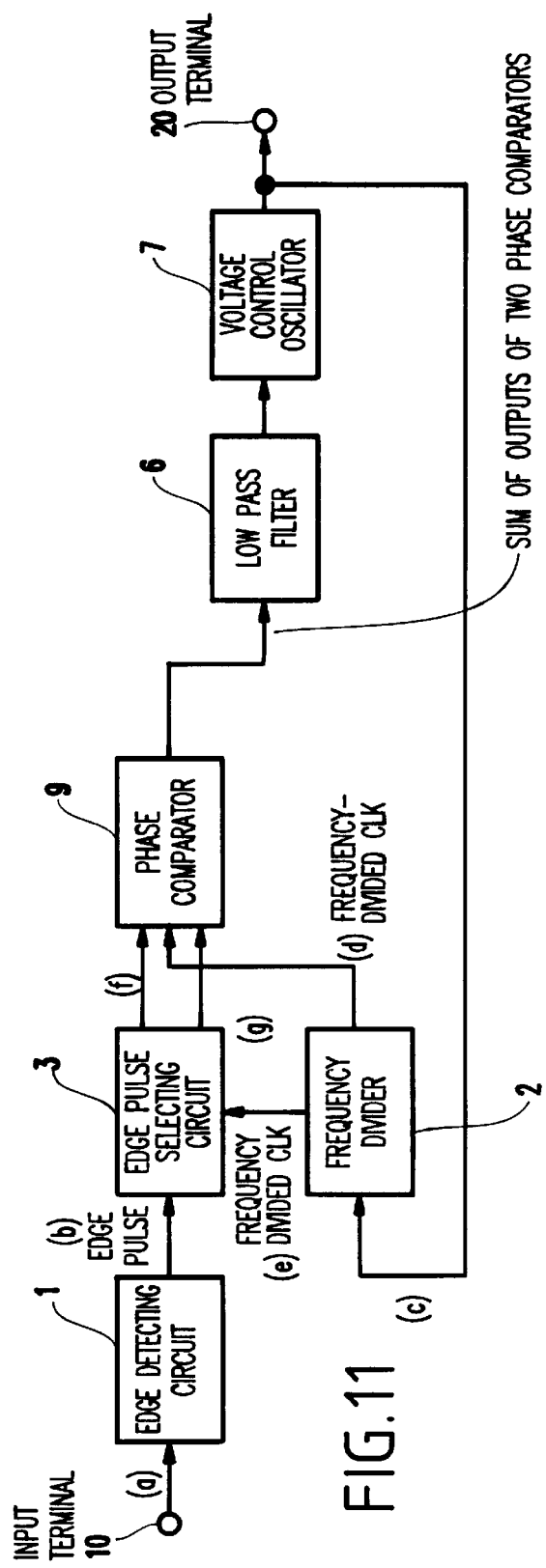

CLOCK EXTRACTION CIRCUIT

BACKGROUND OF THE INVENTION

1. Field of the Invention

The present invention relates to a clock extraction circuit for extracting a timing clock signal from a non-return zero signal used in the field of optical communications or the like and supplying this timing clock signal to an identification reproducer for performing data reproduction.

2. Description of the Related Art

In high-speed digital communications having, for example a transmission speed of 1 [Gb/s] or higher, where data is time-division multiplexed and transmitted/received so as to separate time, a receiving section needs a clock according to a transmission speed for identifying received data or separating time. According to a conventional method, a clock component is extracted from high-speed data before time is separated and, by using this clock, identification and time separation are performed. Consequently, a clock extraction circuit operated at a high speed is necessary and processing greatly depends upon a device characteristic. Especially, in a region where data transmission speed exceeds 1 [Gb/s], it is difficult to realize a high-speed phase comparator.

The conventional clock extraction circuit shown in FIG. 1 comprises edge detecting circuit 1 for detecting the changing point of a non-return zero signal inputted from input terminal 10, phase comparator 4 for comparing, based on the output of edge detecting circuit 1 and the output signal of voltage control oscillator 7, the phase of the received non-return zero signal with that of the output signal of voltage control oscillator 7, low pass filter 6 for outputting only a signal having a specified low frequency, and voltage control oscillator 7 for oscillating a pulse signal according to a signal sent from low pass filter 6 and sending the oscillated pulse signal to output terminal 20 and phase comparator 4.

In the foregoing conventional clock extraction circuit, it is the phase comparator that always determines a speed limit for enabling a stable operation to be performed. In other words, in order to receive a non-return zero signal having a transmission speed of f [b/s], the phase comparator must be operated also at the speed of f [Hz]. However, since there is a limit to the operational speed of a currently available phase comparator, the number of phase comparators that can actually operate stably at high speeds is very small.

As apparent from the foregoing, in a communication system which uses a receiver including the conventional clock extraction circuit, there is a limit to the operational speed of the phase comparator and, consequently, the information transmission speed of the entire communication system is limited.

Some phase comparators that can operate at high speeds have been realized. However, since these are very costly and large in size, it is impossible to satisfy market requests for reduction in cost and size of the device.

Japanese unexamined Patent Publication No. 1988-7050 discloses a timing clock extraction circuit, which comprises a first frequency divider for frequency-dividing the output of a voltage control oscillator to a frequency band nearly equal to the transmission speed of an inputted signal, and a second frequency divider for frequency-dividing the output of the first frequency divider to ½, then the output of the second frequency divider is inputted to a phase comparator. However, this timing clock extraction circuit is disadvantageous in that, as described later, if used for detecting a non-return zero signal, its configuration may produce an error value as a phase difference.

SUMMARY OF THE INVENTION

The present invention was made in order to solve the foregoing problems of the conventional clock extraction circuit, and it is an object of the invention to provide a high operational speed clock extraction circuit to be manufactured compact at low cost.

The present invention is advantageous in that even if a phase comparator having the same operational speed as that of the conventional phase comparator is used, a novel configuration according to the invention enables a high-speed clock extraction to be realized. For the operational speed of the phase comparator included in the conventionally configured clock extraction circuit, an operational speed equal to the transmission speed of data input signal was required. Consequently, the operational speed of the clock extraction circuit is limited by the operational speed of the phase comparator. However, the configuration of the present invention needs only half the transmission speed of a data input signal for the operational speed of the phase comparator. Accordingly, clock extraction can be performed at a high speed. Also, if the same phase comparator as that in the conventional circuit is used, data signal clock extraction can be performed at a high speed up to a transmission speed twice as fast as a conventional speed. Further, according to the present invention, since such a high-speed clock extraction circuit can be configured on a chip, size and costs for the high-speed clock extraction circuit can be reduced more than the conventional case.

The above and other objects, features, and advantages of the present invention will become apparent from the following description referring to the accompanying drawings which illustrate an example of a preferred embodiment of the present invention.

BRIEF DESCRIPTION OF THE DRAWINGS

FIG. 1 is a block diagram showing a configuration of a conventional example.

FIG. 2 is a block diagram showing a configuration of a first embodiment of the present invention.

FIGS. 3a to 3e are time charts each showing problems when phase comparison is performed between signals frequency-divided in the conventional example.

FIGS. 5a to 5g are time charts each illustrating an operation according to the present invention.

FIG. 10 is a block diagram showing a configuration of a third embodiment of the present invention.

FIG. 11 is a block diagram showing a configuration of a fourth embodiment of the present invention.

DETAILED DESCRIPTION OF THE PREFERRED EMBODIMENTS

Figure 4A:
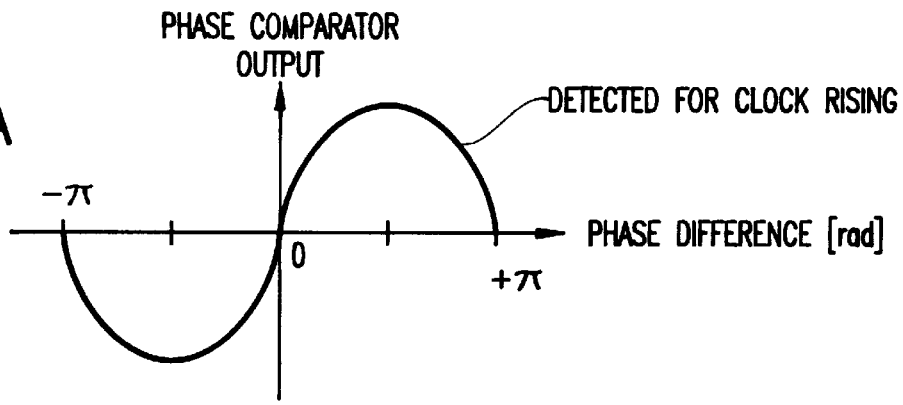
FIGS. 4a to 4c are views each showing an output characteristic of a phase comparator with respect to a phase difference.

Referring to FIG. 2, the clock extraction circuit of the first embodiment comprises edge detecting circuit 1, frequency divider 2, edge pulse selecting circuit 3, first phase comparator 4, second phase comparator 5, low pass filter 6 and voltage control oscillator 7.

For an input data signal inputted from input terminal 10, its changing point is detected by edge detecting circuit 1. An edge pulse is then outputted according to the detected changing point.

The edge pulse is inputted to edge pulse selecting circuit 3. Two kinds of pulses, described later, are selected.

An extracted clock signal from voltage control oscillator 7 is frequency-divided by frequency divider 2.

By using each of the selected two edge pulses, the extracted clock signal which has been frequency-divided is inputted to two phase comparators 4 and 5. The phase of the input data signal is compared with that of the frequency-divided clock signal. Then, a signal corresponding to a phase difference between the foregoing signals is sent to low pass filter 6.

When comparing phases between the received input data signal and the frequency-divided clock signal from voltage control oscillator 7, the following problem may occur. As in the conventional case, if the changing point of the inputted signal is to be detected based on the rising/falling edge of the input data signal and, by using an obtained edge pulse, phase difference information for the clock signal of the voltage control oscillator after frequency division is to be obtained, completely opposite positive and negative outputs may be produced even if phase differences are the same.

FIGS. 3a to 3d each illustrates the foregoing condition.

Specifically, FIG. 3a shows an NRZ data signal to be inputted, FIG. 3b shows an edge pulse produced by detecting the rising/falling edge of the signal of FIG. 3a, and FIG. 3c shows a clock signal outputted from the voltage control oscillator. FIG. 3d shows a signal obtained after frequency-dividing a clock signal outputted from the voltage control oscillator.

Conventionally, based on the edge pulse of FIG. 3b, a phase difference between the extracted clock signal of FIG. 3c and the input data of FIG. 3a is detected. As shown in FIG. 3c, the edge pulse and the clock signal are compared for rising by the phase comparator and then a value corresponding to its phase difference is outputted. FIG. 3c shows a condition where a phase difference Φ is detected.

However, if the conventional phase difference detection is performed while the extracted clock is in a frequency-divided state, the following problem may occur. Since originally this phase detector detects the phase difference by using the rising edges of two signals, in this way, even if phase differences must be performed not only for rising edge of the frequency-divided clock signal but also falling edge of the frequency-divided clock signal, as shown in FIG. 3d, a phase difference is detected before a rising edge before a half cycle and, consequently, mistaken phase difference information may be outputted. The drawing shows a condition where when a phase difference is detected for the falling edge of the frequency-divided clock signal for the phase difference Φ, a mistaken value like a phase difference Φ+π is outputted for an actual phase difference Φ.

It is not at all possible to predict such a mistake, because inputted signals are random signals.

FIG. 4a shows, corresponding to the conventional example of FIG. 1, an example of a relationship between a phase difference and an output when a phase difference is detected for the rising edge of an extracted clock signal by the phase comparator.

It can be understood that the output of the phase comparator is uniquely determined for an optional phase difference, the output of the phase comparator is monotonously increased for a phase difference between $-\pi/2$ to $+\pi/2$ and a clock can be extracted. However, such a configuration has a high-speed operational problem like that described above in the section on the Related Art.

Figure 4B:
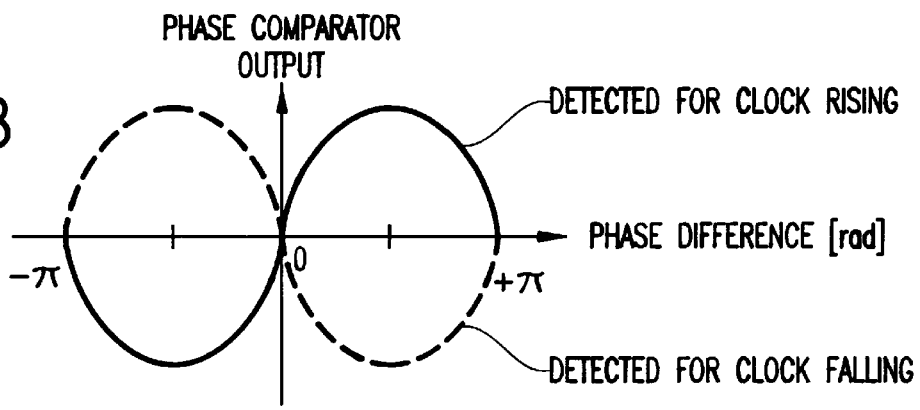

FIG. 4b shows a relationship between a phase difference and the output of the phase comparator when the conventional phase comparison is performed after frequency-dividing a clock as described above with reference to FIG. 3d (when the phase comparator performs phase difference detection for both rising and falling edges of an extracted clock).

Specifically, FIG. 4b shows a condition where the output of the phase comparator can take two values for a given phase difference. In this case, however, clock extraction is impossible.

As described above, if the conventional configuration is employed, accurate phase comparison cannot be performed after frequency-dividing one selected from input data and an extracted clock or both. In order to solve such a problem inherent in the conventional configuration, the present invention provides a clock extraction circuit for performing signal reproduction by receiving a non-return zero signal. This clock extraction circuit has a configuration, where the use of an edge pulse outputted from an edge detecting circuit is determined, for a frequency-divided clock, for at least one selected from detection for its rising edge and detection for its falling edge.

The operational principle of the clock extraction circuit of the present invention will be described by referring to FIGS. 5a to 5g.

Figures 5A, 5B, 5C, 5D, 5E:
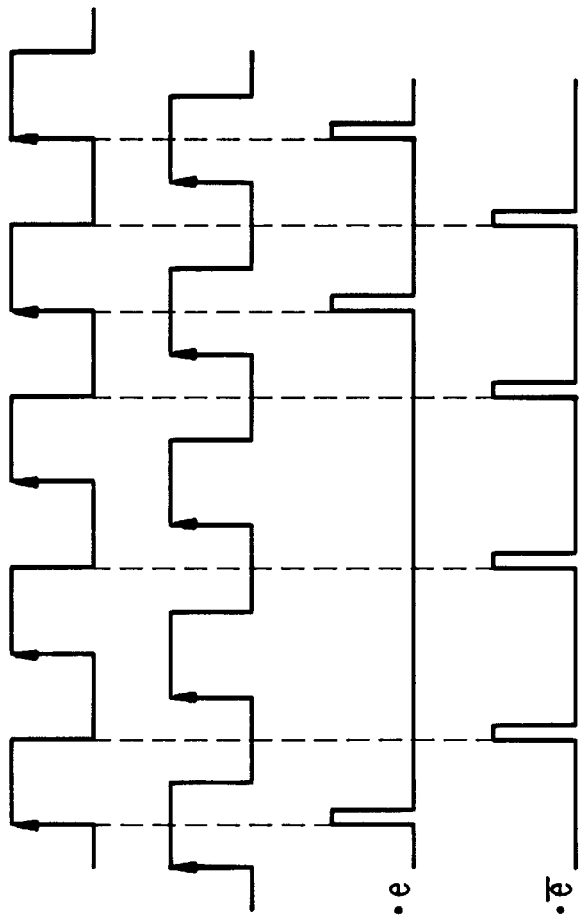

The waveforms of FIGS. 5a to 5d are the same as those of FIGS. 3a to 3d. FIG. 5e shows a waveform obtained by advancing, by 90 degrees, the phase of the frequency-divided clock signal of FIG. 5d. As shown by the block diagram of FIG. 2, the edge pulse selecting circuit of the present invention uses the waveform of FIG. 5e. FIGS. 5f and 5g show waveforms selected by the edge pulse selecting circuit. Specifically, FIG. 5f shows AND between all the edge pulses of FIGS. 5b and 5e outputted from the edge detecting circuit. On the other hand, FIG. 5g shows AND between the edge pulse of FIG. 5b and the negative edge pulse of FIG. 5e. As indicated by dotted lines for connecting FIG. 5d and FIGS. 5f to 5g, FIG. 5f shows an edge pulse used for detection only for a rising edge of FIG. 5d. FIG. 5g shows an edge pulse used for detection only for a falling edge of FIG. 5d. The use of these selected edge pulses enables the phase comparator to be used differently depending upon phase comparison with the rising edge of the frequency-divided clock or with its falling edge. Accordingly, accurate phase comparison can be performed even after frequency division, and clock extraction can be performed.

Two phase comparators 4 and 5 shown in FIG. 2 are respectively in charge of phase comparison for a clock rising edge and phase comparison for a clock falling edge. As shown in FIG. 2, since the second phase comparator performs phase comparison only for the falling edge of a frequency-divided clock, its output must be inverted before a sum with the output of the first phase comparator is obtained.

Figure 4C:
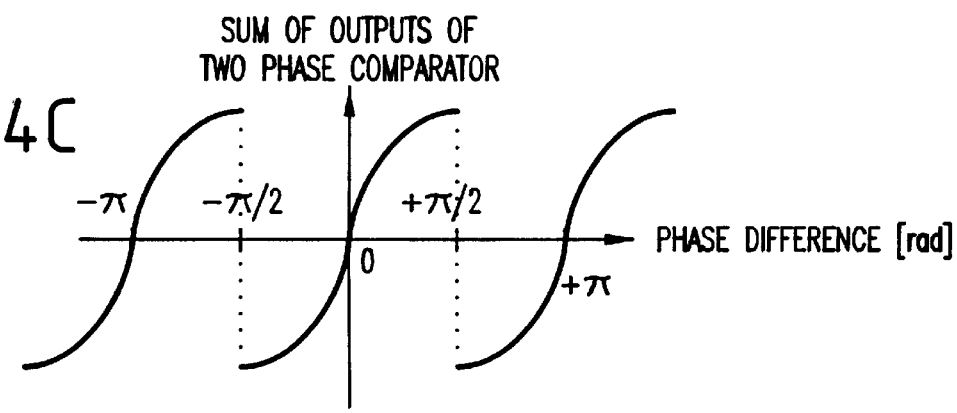

FIG. 4c shows a characteristic of the sum of the outputs of the two phase comparators of the present invention with respect to a phase difference.

It can be understood from the drawing that the output of the phase comparator is uniquely decided for a given phase difference, the output of the phase comparator is monotonously increased for a phase difference between −π/2 and +π/2 and clock extraction can be performed. From its characteristic, it can also be understood that synchronism is taken between a frequency-divided clock and input data not only when a phase difference is 0 but also when a phase is delayed by +π as shown in FIG. 3e. However, since in the case of an extracted clock before frequency division, +π phase delaying of the frequency-divided clock is equivalent to +2 π phase delaying of the original extracted clock, the foregoing situation is not a problem at all.

The sum of the outputs of the two phase comparators is inputted to the low pass filter. This output sum is outputted from the low pass filter after superfluous high frequency components are eliminated. Based on the output of the low pass filter, the voltage control oscillator is controlled, and phase synchronism is taken so as to make a clock signal f [Hz] outputted from the voltage control oscillator equal to the data transmission speed f [b/s] of an inputted data signal. The extracted clock is outputted from output terminal 20 to the outside.

Figure 6:
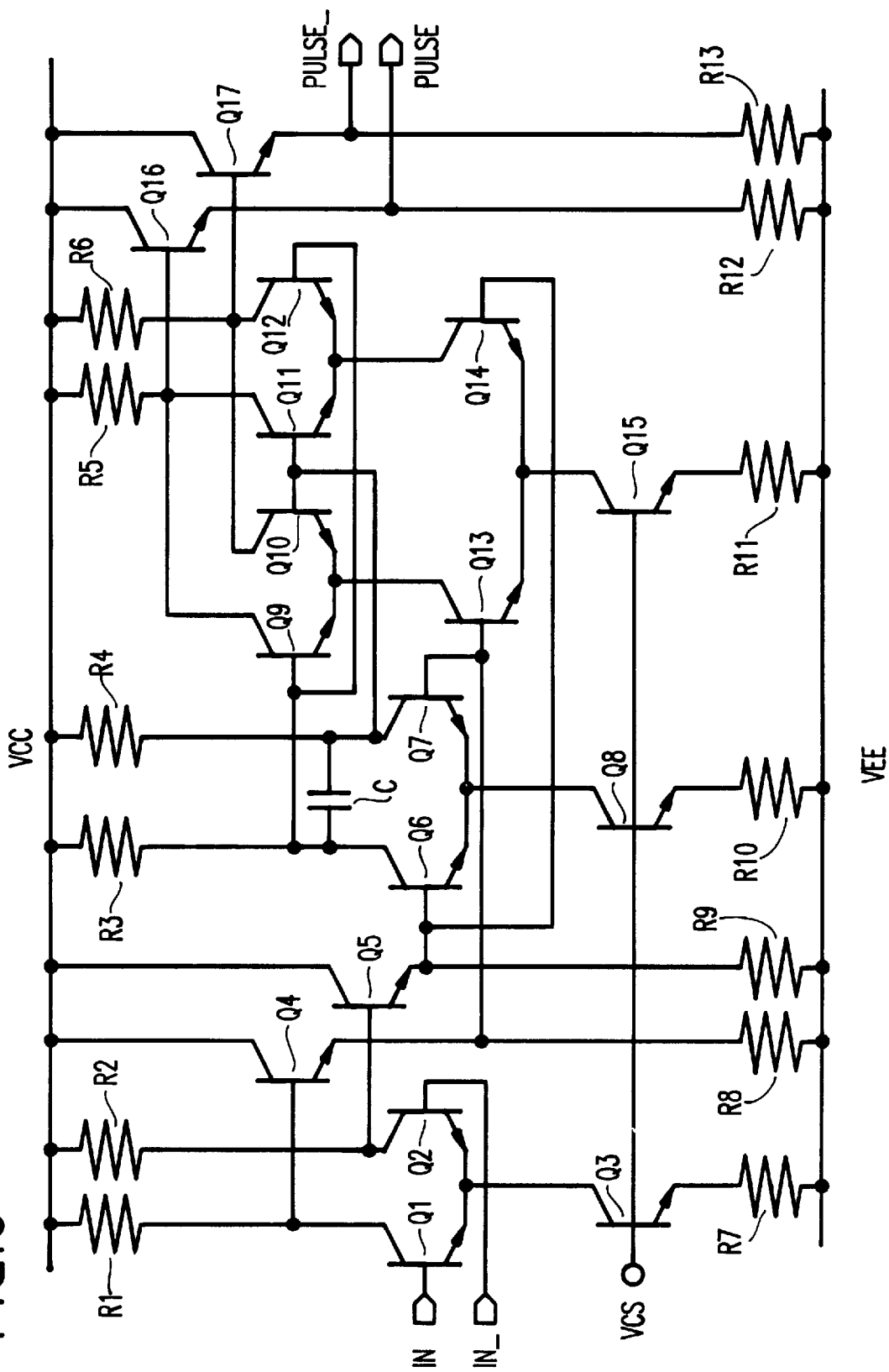
FIG. 6 is a circuit diagram showing an example of an edge detecting circuit.
Figure 7:
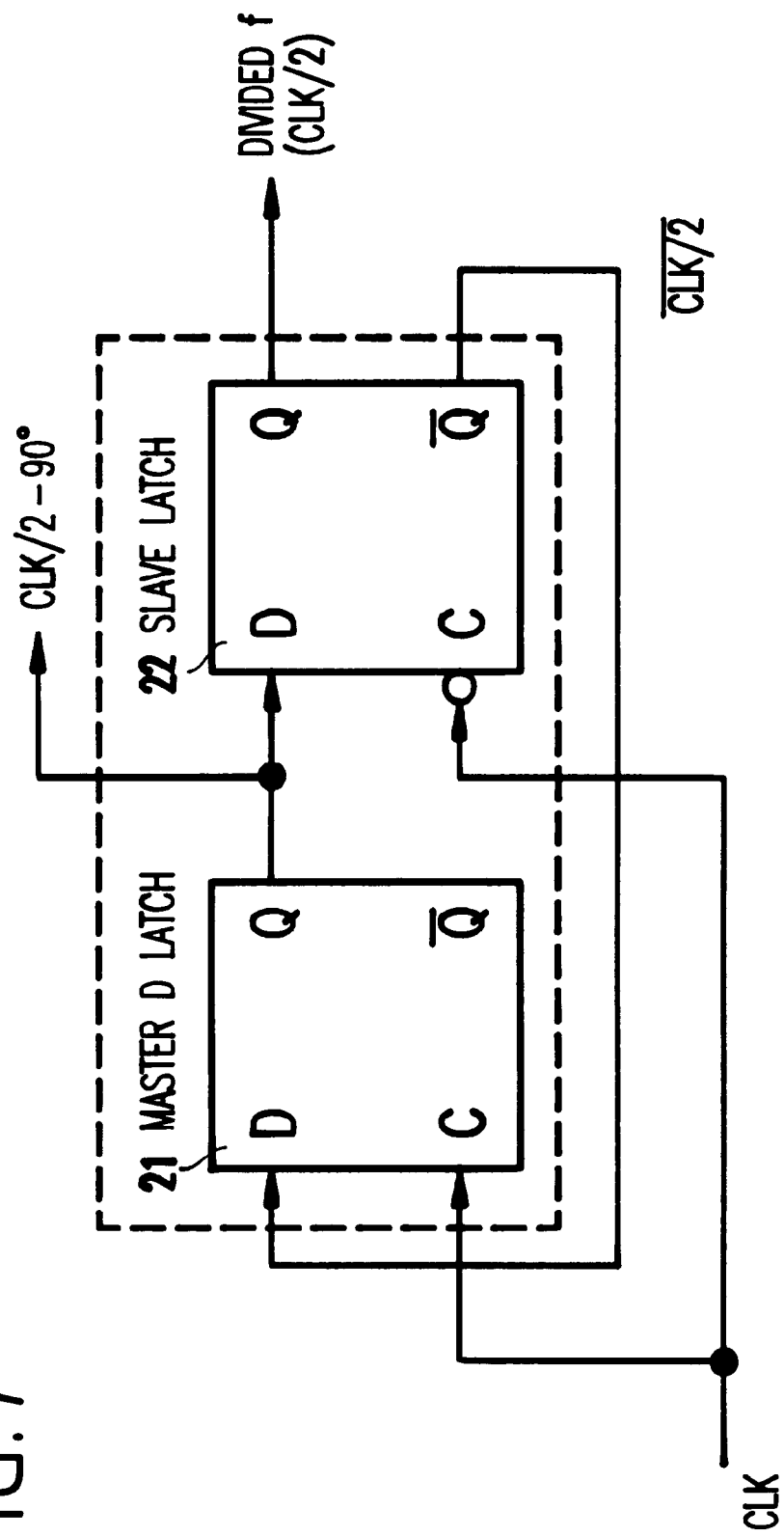
FIG. 7 is a circuit diagram showing an example of a frequency divider.
Figure 8:
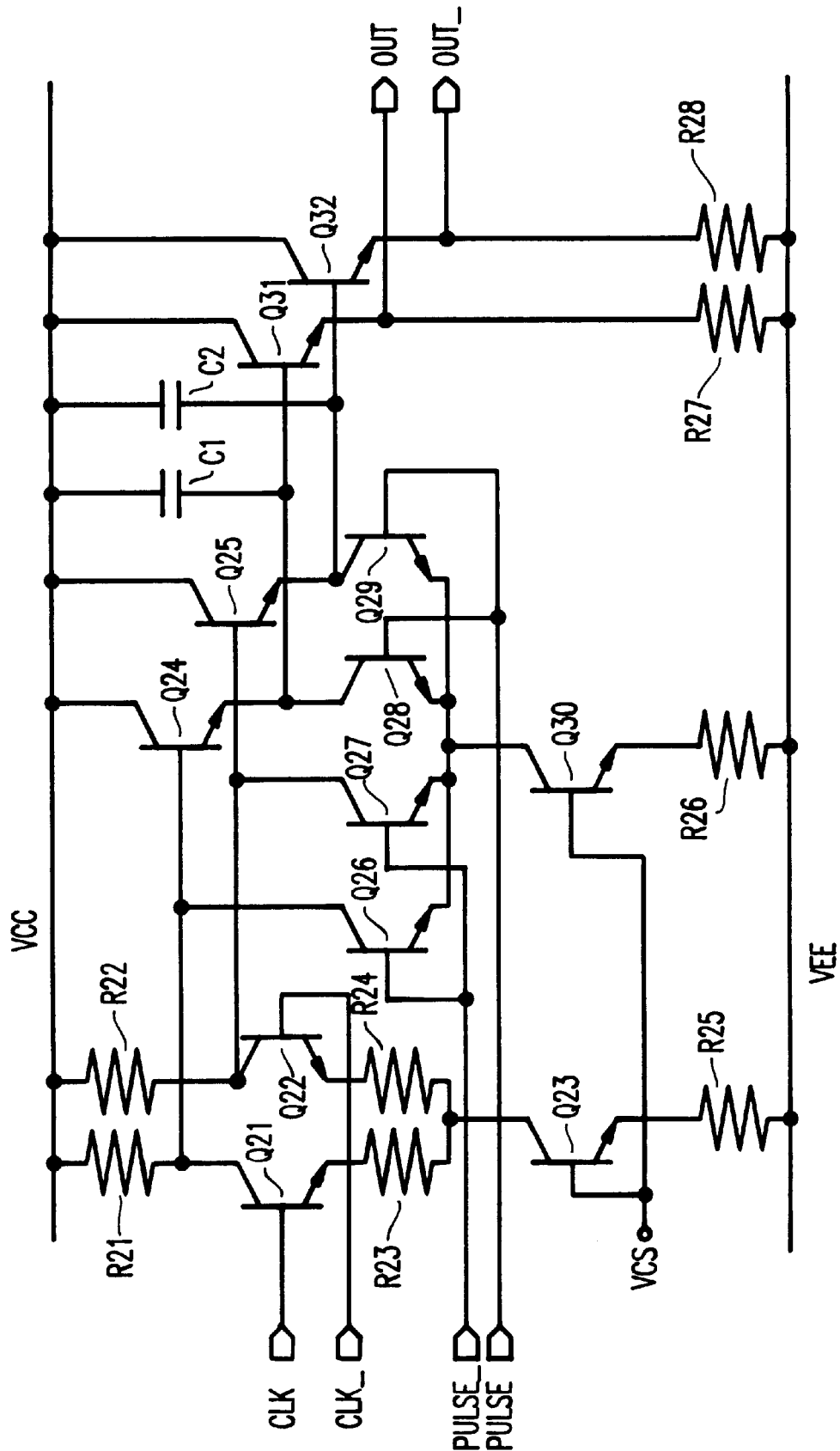
FIG. 8 is a circuit diagram showing an example of a phase comparator.

FIG. 6 shows one specific example of an edge detecting circuit. FIG. 7 shows one specific example of a frequency divider. FIG. 8 shows one specific example of a phase comparator.

Next, the second embodiment of the present invention will be described in detail with reference to the drawings.

Figure 9:
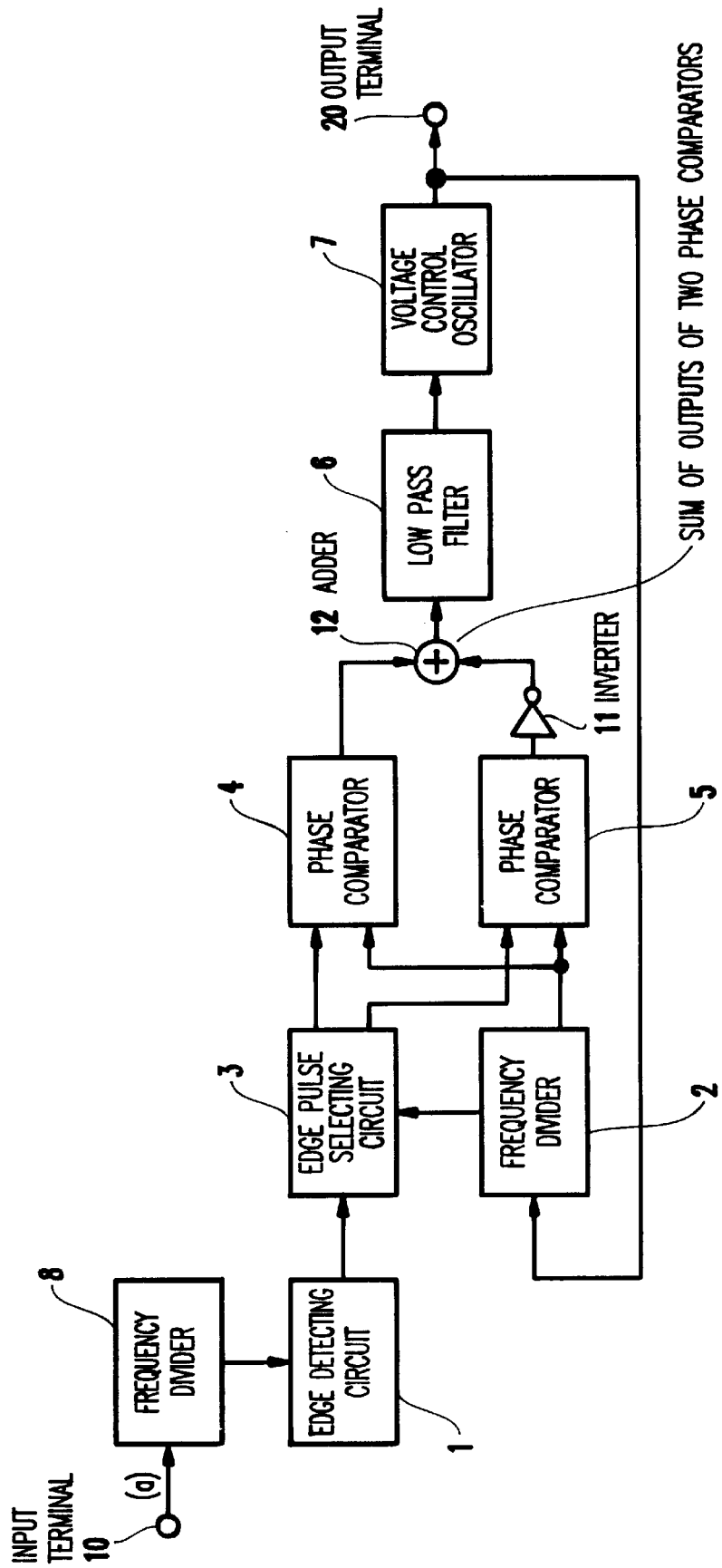
FIG. 9 is a block diagram showing a configuration of a second embodiment of the present invention.

FIG. 9 illustrates the clock extraction circuit of the second embodiment of the present invention. This clock extraction circuit comprises first frequency divider 2, edge detecting circuit 1, second frequency divider 8, edge pulse selecting circuit 3, first and second phase comparators 4 and 5, low pass filter 6 and voltage control oscillator 7.

An input data signal inputted from input terminal 10 is frequency-divided by second frequency divider 8. Then, the frequency-divided input data enters edge detecting circuit 1 and its changing point is detected. An edge pulse corresponding to the detected changing point is then outputted. An extracted clock signal from voltage control oscillator 7 is frequency-divided by first frequency divider 2. The foregoing edge pulse is inputted to edge pulse selecting circuit 3. Then, depending on phase comparison for the rising edge of the frequency divided clock or for the falling edge thereof, two edge pulses are selected.

By using the respective edge pulses, phase comparison is performed by first and second phase comparators 4 and 5 between the frequency-divided input data signal and the frequency-divided clock signal. Then, a signal corresponding to a phase difference detected between these signals is sent through the low pass filter to voltage control oscillator 7.

The extracted clock is outputted through output terminal 20 to the outside. The input data is not inputted to edge detecting circuit 1. Instead, the input data is first frequency-divided by frequency divider 8 and then inputted to edge detecting circuit 1. Other than this operation, the operation of each section is the same as that of the first embodiment.

In the second embodiment, not only the extracted clock signal but also the input data are frequency-divided. An edge pulse is produced based on the changing point of the frequency-divided input data. Edge pulse selecting circuit 3 selects edge pulses separately between the phase comparison for the rising edge of the frequency-divided clock and the phase comparison for the falling edge thereof. In two phase comparators 4 and 5, the selected edge pulses and the frequency-divided extracted clock signal are inputted and phases are compared between the frequency-divided input data signal and the frequency-divided clock signal. Then, a signal obtained according to a phase difference between these signals is sent through the low pass filter to voltage control oscillator 7. The operations performed thereafter are the same as those of the first embodiment. However, in the second embodiment, since a detected pulse and a clock signal inputted to the phase comparators are both frequency-divided, the phase comparators can be operated at lower speeds and, even if the transfer speed of an input data signal is high, phase comparison can be more assured. In the embodiment, frequency divider 8 for frequency-dividing an inputted NRZ signal and frequency divider 2 for frequency-dividing a clock signal outputted from voltage control oscillator 7 are provided. Based on a pulse signal outputted from edge pulse selecting circuit 3 and the clock signal frequency-divided by frequency divider 2, phases are compared between a non-return zero signal frequency-divided by frequency divider 8 and the clock signal outputted from voltage oscillator 7 and frequency-divided by frequency divider 2. However, the clock extraction circuit may be configured in such a manner that no frequency divider 2 is provided and, based on a pulse signal outputted from edge pulse selecting circuit 3 and a clock signal outputted from voltage control oscillator 7, phases are compared between a non-return zero signal frequency-divided by frequency divider 8 and the clock signal outputted from voltage control oscillator 7.

Next, the third embodiment of the present invention will be described by referring to FIG. 10.

In the first embodiment, when phase comparison is to be performed for the rising/falling edge of a frequency-divided clock, in order to realize correct phase comparison, the output of the second phase comparator is inverted with respect to the output of the first phase comparator, and the sum of the outputs thereof is obtained and then inputted to the low pass filter.

However, in the third embodiment shown in FIG. 10, without inverting the output of the second phase comparator for performing phase comparison for a falling edge with respect to that of the first phase comparator for performing phase comparison for a rising edge, a frequency-divided clock for phase comparison can be used in its inverted state. Accordingly, the output sides of the two phase comparators are symmetrical to each other in configuration, and it is expected that difference components contained in the outputs of the phase comparators can be reduced.

Lastly, the fourth embodiment of the present invention will be described by referring to FIG. 11.

Figure 12:
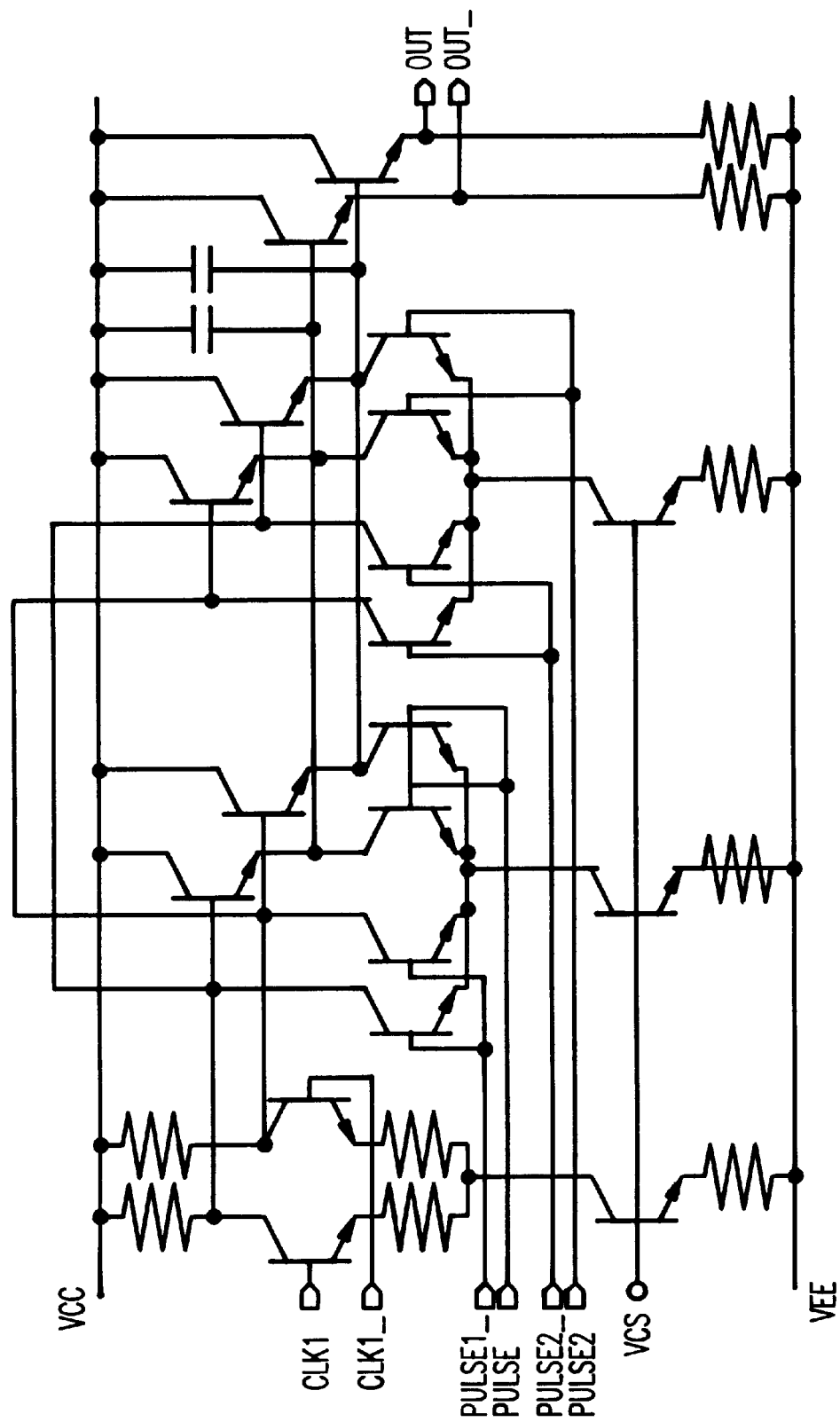
FIG. 12 is a circuit diagram showing an example of a double edge detecting circuit.

Each of the foregoing embodiments needs two phase comparators. However, as shown in FIG. 12, by improving the configuration of the phase comparator shown in FIG. 8, a circuit configuration can be realized, which enables one phase comparator to perform phase comparison for both rising and falling edges. In this way, the simply configured clock extraction circuit of the present invention like that shown in FIG. 11 can be realized. It is expected that the use of this clock extraction circuit can reduce the number of elements and power consumption.

It is to be understood that variations and modifications of CLOCK EXTRACTION CIRCUIT disclosed herein will be evident to those skilled in the art. It is intended that all such modifications and variations be included within the scope of the appended claims.

What is claimed is:

1. A clock extraction circuit comprising:
   a first frequency divider for frequency-dividing a received non-return zero signal by two;
   an edge detecting circuit for detecting a changing point of a signal outputted from said first frequency divider;
   a voltage control oscillator for oscillating a clock signal in a frequency region nearly equal to a transmission rate of said non-return zero signal;
   a second frequency divider for frequency-dividing said clock signal oscillated by said voltage control oscillator by two;
   a selecting circuit for selecting edge pulses detected by said edge detecting circuit, and
   a phase comparator for comparing phases between said non-return zero signal frequency-divided by first frequency divider and said clock signal frequency-divided by said second frequency divider based on each of said edge pulses selected by said selecting circuit,
   wherein said edge pulse selecting circuit includes means for dividing said edge pulses according to cases by using a frequency-divided clock signal phase-shifted by 90 degrees from said frequency-divided clock signal.

2. A clock extraction circuit comprising:
   an edge detecting circuit for detecting a changing point of a received non-return zero signal;
   a voltage control oscillator for oscillating a clock signal in a frequency region nearly equal to a transmission rate of said non-return zero signal;
   a frequency divided for frequency-dividing said clock signal oscillated by said voltage control oscillator by two;
   a selecting circuit for selecting edge pulses detected by said edge detecting circuit; and
   a phase comparator for comparing phases between said non-return zero signal and said clock signal frequency-divided by said frequency divider based on each of said edge pulses selected by said selecting circuit;
   wherein said edge pulse selecting circuit includes means for dividing said edge pulses according to cases by using a frequency-divided clock signal phase-shifted by 90 degrees from said frequency-divided clock signal.

3. A clock extraction circuit comprising:
   a frequency divider for frequency-dividing a received non-return zero signal by two;
   an edge detecting circuit for detecting a changing point of a signal outputted from said frequency divider;
   a voltage control oscillator for oscillating a clock signal in a frequency region nearly equal to a transmission rate of said non-return zero signal;
   a selecting circuit for selecting edge pulses detected by said edge detecting circuit; and
   a phase comparator for comparing phases between said non-return zero signal frequency-divided by said frequency divider and said clock signal based on each of said edge pulses selected by said selecting circuit,
   wherein said edge pulse selecting circuit includes means for dividing said edge pulses according to cases by using an extracted clock signal phase-shifted by 90 degrees from an extracted clock signal.

* * * * *